United States Patent
Okamura et al.

(10) Patent No.: US 9,269,992 B2
(45) Date of Patent: Feb. 23, 2016

(54) BATTERY, BATTERY PACK, BATTERY CHARGER, AND BATTERY CHARGING SYSTEM

(75) Inventors: Kenichi Okamura, Kanagawa (JP); Tadashi Morita, Tokyo (JP)

(73) Assignee: SONY CORPORATION, Tokyo (JP)

( * ) Notice: Subject to any disclaimer, the term of this patent is extended or adjusted under 35 U.S.C. 154(b) by 1036 days.

(21) Appl. No.: 13/353,463

(22) Filed: Jan. 19, 2012

(65) Prior Publication Data

US 2012/0206102 A1 Aug. 16, 2012

(30) Foreign Application Priority Data

Feb. 15, 2011 (JP) .................................. 2011-030057

(51) Int. Cl.
| | |
|---|---|
| *H02J 7/00* | (2006.01) |
| *H01M 10/42* | (2006.01) |
| *H04Q 9/00* | (2006.01) |
| *G01R 31/36* | (2006.01) |
| *H01M 6/42* | (2006.01) |

(52) U.S. Cl.
CPC ........... *H01M 10/425* (2013.01); *H02J 7/0016* (2013.01); *H04Q 9/00* (2013.01); *G01R 31/3658* (2013.01); *H01M 6/42* (2013.01); *H01M 2010/4271* (2013.01); *H04Q 2209/47* (2013.01); *H04Q 2209/86* (2013.01); *H04Q 2209/88* (2013.01)

(58) Field of Classification Search
CPC ....... H02J 7/025; H02J 7/0013; H02J 7/0014; H02J 7/0016; G01R 31/3658; H01M 10/425; H04Q 2209/47; H04Q 9/00

USPC .................. 320/108, 112, 116, 122; 455/41.2
See application file for complete search history.

(56) References Cited

U.S. PATENT DOCUMENTS

| | | | |
|---|---|---|---|
| 8,344,685 B2 * | 1/2013 | Bertness et al. ............... | 320/104 |
| 8,463,332 B2 * | 6/2013 | Sato et al. ...................... | 455/573 |
| 2006/0152190 A1 * | 7/2006 | Riemschneider ............. | 320/106 |
| 2010/0320962 A1 * | 12/2010 | Sekita et al. .................. | 320/108 |
| 2012/0139491 A1 * | 6/2012 | Eberhard et al. .............. | 320/118 |

FOREIGN PATENT DOCUMENTS

| | | |
|---|---|---|
| CN | 101931250 | 12/2010 |
| JP | 2002-320334 | 10/2002 |

OTHER PUBLICATIONS

Chinese Office Examination Report issued in connection with related Chinese Patent Application No. CN 201210027708.9 dated Jan. 28, 2015.

* cited by examiner

*Primary Examiner* — Richard Isla Rodas
*Assistant Examiner* — Nathaniel Pelton
(74) *Attorney, Agent, or Firm* — Dentons US LLP

(57) ABSTRACT

Disclosed herein is a battery. The battery includes a contactless communication control block configured to execute contactless communication as a transponder and a reader/writer which are based on electromagnetic induction. The battery further includes an antenna configured to execute the contactless communication as the transponder; and an antenna configured to execute the contactless communication as the reader/writer. The battery further includes a battery control block configured to control a charge operation of a cell block. The contactless communication control block communicates, in a contactless manner, a charge state of the cell block supplied from the battery control block.

16 Claims, 10 Drawing Sheets

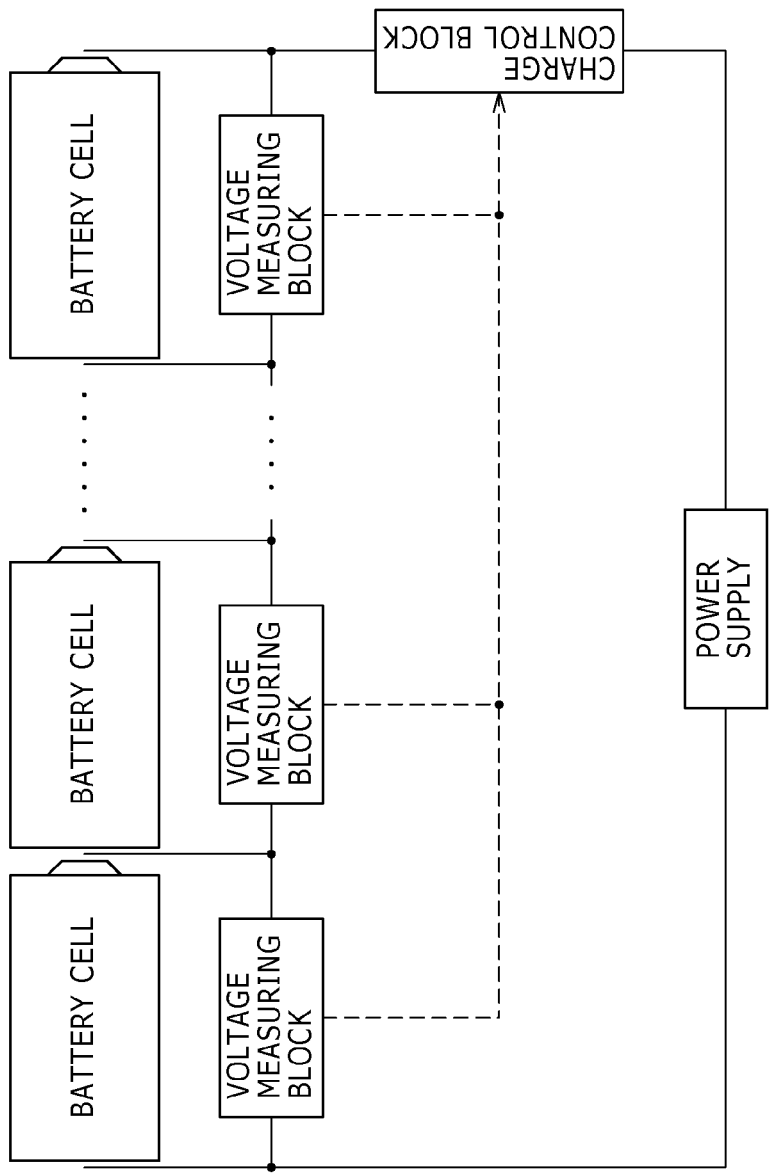
F I G . 1

F I G . 5
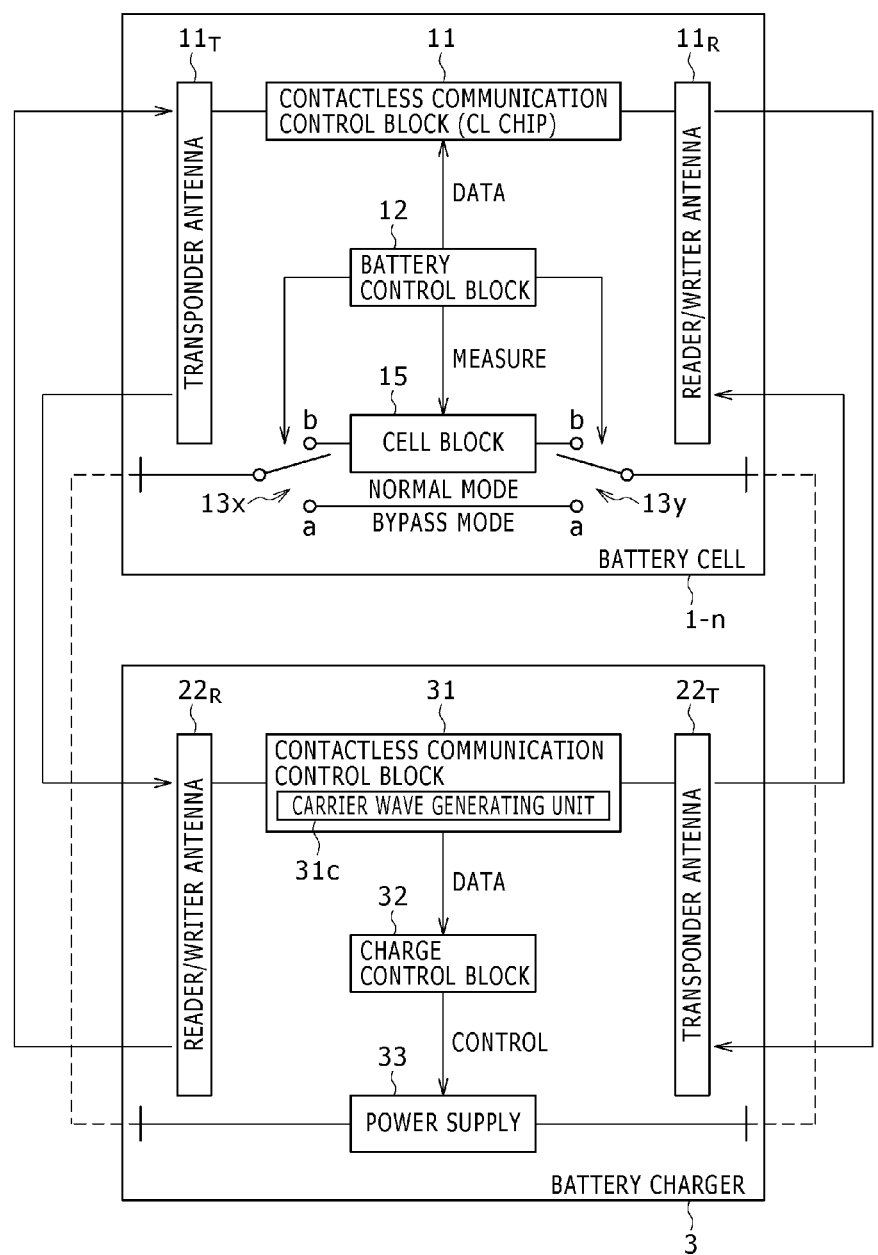

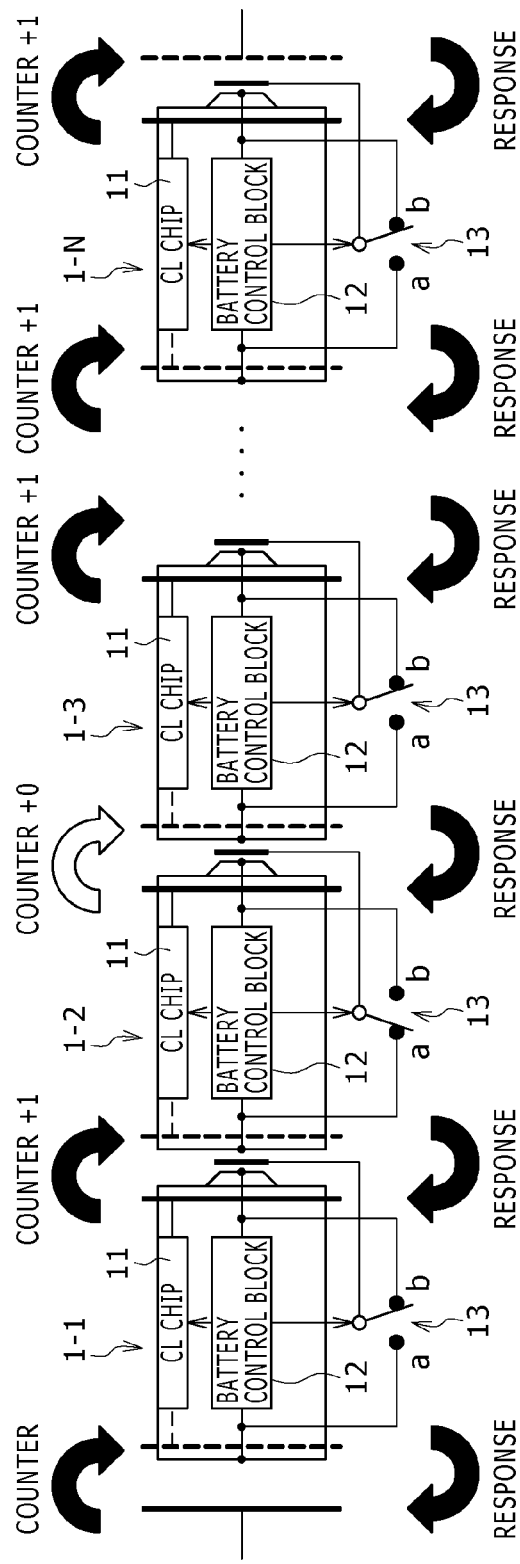

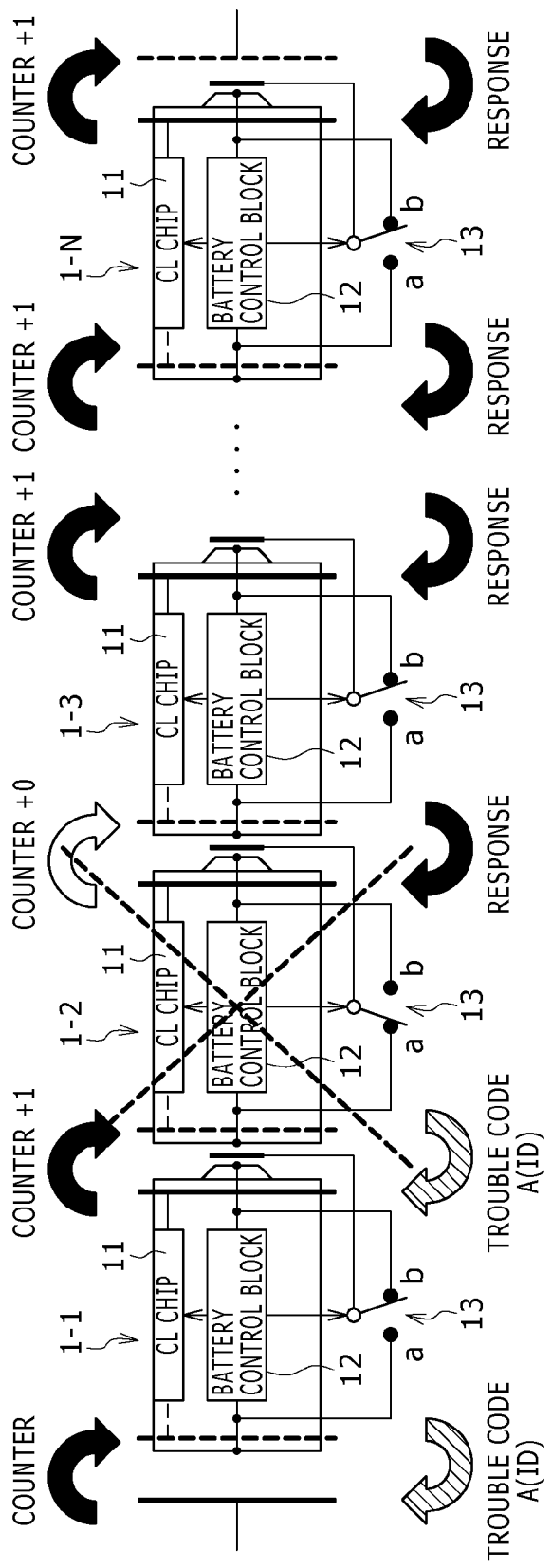

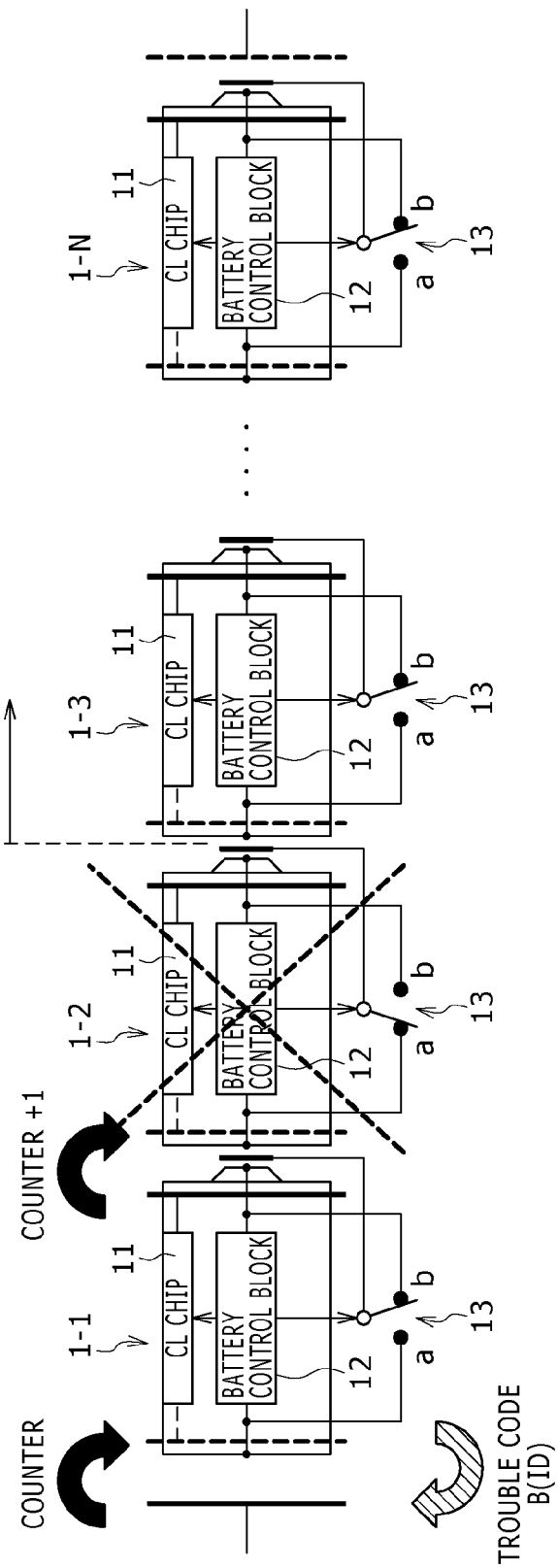

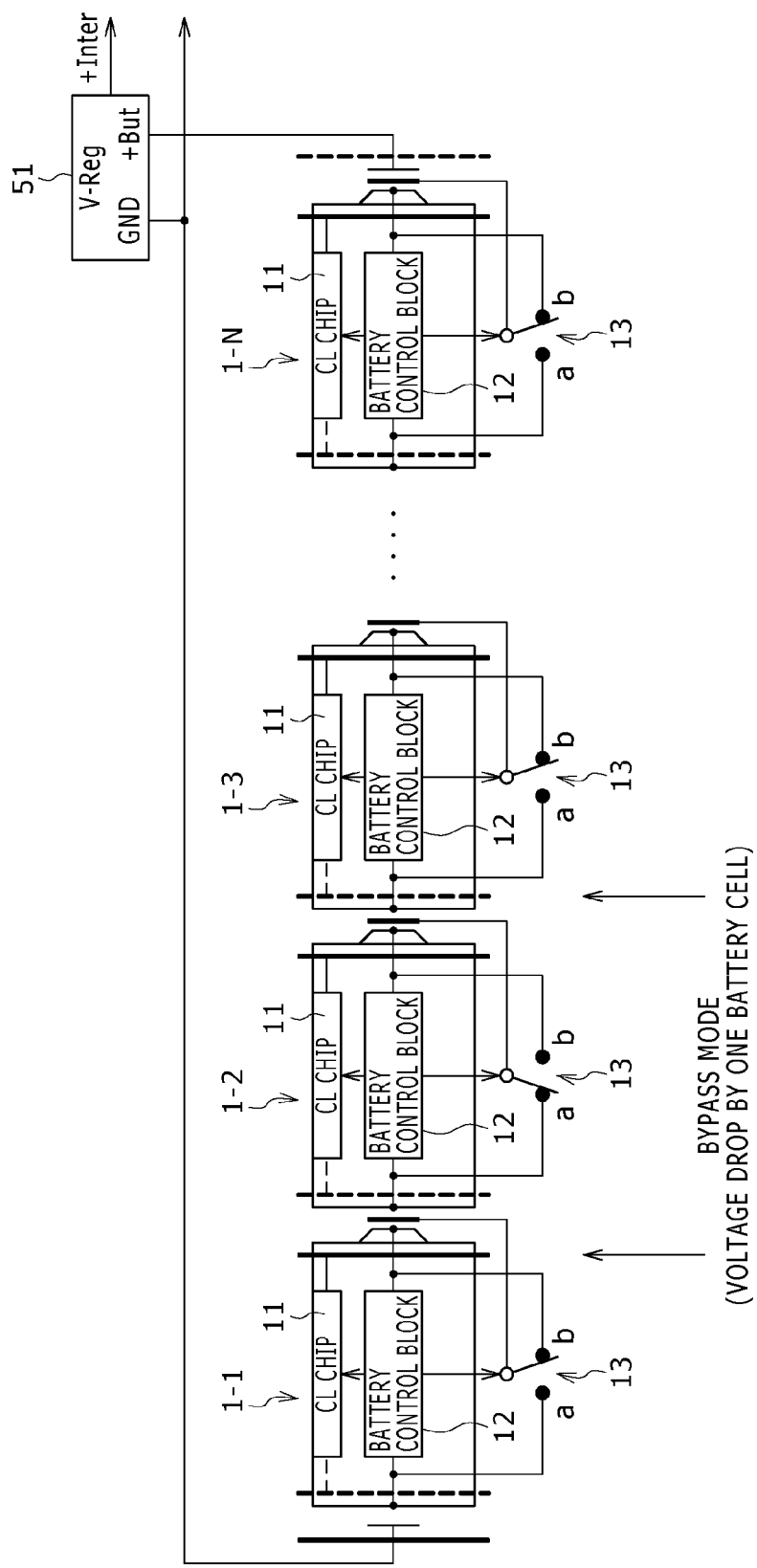

BATTERY, BATTERY PACK, BATTERY CHARGER, AND BATTERY CHARGING SYSTEM

BACKGROUND

The present disclosure relates to a battery, a battery pack, a battery charger, and a battery charging system and, more particularly, to a battery, a battery pack, a battery charger, and a battery charging system which are configured to execute, on the basis of a simple structure, charge/discharge control on battery cells even if the number of battery cells increases.

Charging a battery pack made up of two or more interconnected battery cells requires the consideration of a cell balance while checking the capacity, charge/discharge characteristics, and temperature of each battery cell, thereby executing charge/discharge control (refer to Japanese Patent Laid-open No. 2002-320334 for example). For this reason, each battery cell has had the wiring dedicated to the obtaining of such charge/discharge control data as the cell voltage and temperature shown as enclosed by dashed lines shown in FIG. 1.

SUMMARY

However, as with a large-size battery pack requiring a large capacity, for example, as the number of battery cells increases, the number of wires for obtaining charge/discharge control data increases, resulting in a battery pack of a complicated structure.

Therefore, the present disclosure addresses the above-identified and other problems associated with related-art methods and apparatuses and solves the addressed problems by providing a battery, a battery pack, a battery charger, and a battery charging system which are configured to execute charging and discharging control on the basis of a simple structure even if the number of battery cells in a battery pack increases.

In carrying out the present disclosure and according to a first mode thereof, there is provided a battery. This battery has a contactless communication control block configured to execute contactless communication as a transponder and a reader/writer which are based on electromagnetic induction; an antenna configured to execute the contactless communication as the transponder; an antenna configured to execute the contactless communication as the reader/writer; and a battery control block configured to control a charge operation of a cell block. In this setup, the contactless communication control block communicates, in a contactless manner, a charge state of the cell block supplied from the battery control block.

In the first mode of the present disclosure, the charging of the cell block is controlled. A charge state of the cell block is communicated by contactless communication as a transponder and a reader/writer which are based on electromagnetic induction.

In carrying out the present disclosure and according to a second mode thereof, there is provided a battery pack. This battery pack has a plurality of battery cells interconnected in series. Each of the plurality of battery cells has a contactless communication control block configured to execute contactless communication as a transponder and a reader/writer which are based on electromagnetic induction; an antenna configured to execute the contactless communication as the transponder; an antenna configured to execute the contactless communication as the reader/writer; and a battery control block configured to control a charge operation of a cell block. In this setup, the contactless communication control block communicates, in a contactless manner, a charge state of the cell block supplied from the battery control block with the contactless communication control block of the battery cell adjacent to one of connection sides of the battery cell.

In the second mode of the present disclosure, two or more battery cells are interconnected in series. Each of the interconnected battery cells is controlled in the charging of the cell block. The charge state is communicated between the interconnected battery cells by contactless communication as a transponder and a reader/writer which are based on electromagnetic induction.

In carrying out the present disclosure and according to a third mode thereof, there is provided a charger. This charger has a contactless communication control block configured to execute contactless communication as a transponder and a reader/writer which are based on electromagnetic induction; an antenna configured to execute the contactless communication as the transponder; an antenna configured to execute the contactless communication as the reader/writer; and a charge control block configured to control a charge current to be supplied to a battery to be charged. In this setup, the contactless communication control block communicates a charge state of the battery in a contactless manner and the charge control block controls the charge current in accordance with a charge state of the battery received by the contactless communication.

In the third mode of the present disclosure, contactless communication is executed as a transponder and a reader/writer which are based on electromagnetic induction. The charge state of a battery to be charged is communicated by contactless communication. In accordance with the charge state of the battery received by contactless communication, a charge current is controlled.

In carrying out the present disclosure and according to a fourth mode thereof, there is provided a charging system. This charging system has a battery pack and a charger. The battery pack has a plurality of battery cells interconnected in series. Each of the plurality of battery cells has a contactless communication control block of a battery cell configured to execute contactless communication as a transponder and a reader/writer which are based on electromagnetic induction; an antenna configured to execute the contactless communication as the transponder; an antenna configured to execute the contactless communication as the reader/writer; and a battery control block configured to control a charge operation of a cell block. In this setup, the contactless communication control block of the battery cell communicates, in a contactless manner, a charge state of the cell block supplied from the battery control block with the contactless communication control block of the battery cell adjacent to one of connection sides of the battery cell. The charger has a contactless communication control block of the charger configured to execute contactless communication as a transponder and a reader/writer which are based on electromagnetic induction; an antenna configured to execute the contactless communication as the transponder; an antenna configured to execute the contactless communication as the reader/writer; and a charge control block configured to control a charge current to be supplied to a battery pack. In this setup, the contactless communication control block of the charger communicates a charge state of the battery pack in a contactless manner and the charge control block controls the charge current in accordance with a charge state of the battery pack received by the contactless communication.

In the fourth mode of the present disclosure, in the battery pack in which two or more battery cells are interconnected in series, each of the battery cells is controlled in the charging of the cell block. The charge state is communicated between the battery cells by contactless communication as a transponder and a reader/writer which are based on electromagnetic induction. In the charger, contactless communication is executed with the battery pack as a transponder and a reader/writer which are based on electromagnetic induction. The charge state of the battery pack is communicated by contactless communication. In accordance with the charge state of the battery pack received by contactless communication, a charge current is controlled.

According to the first and second modes of the present disclosure, charge/discharge control can be executed with a simple structure if the number of battery cells increases.

According to the third and fourth modes of the present disclosure, charge/discharge control can be properly executed on the battery of the first mode or the battery pack of the second mode.

BRIEF DESCRIPTION OF THE DRAWINGS

FIG. 1 is a schematic diagram illustrating a related-art wiring for charge/discharge control;

FIG. 5 is a functional block diagram illustrating an exemplary functional configuration of a battery cell and a battery charger;

FIG. 6 is a schematic diagram for explaining operations of two or more battery cells which are normally charged;

FIG. 7 is a schematic diagram for explaining operations of two or more battery cells on which a self-diagnosable trouble has occurred;

FIG. 8 is a schematic diagram for explaining operations of two or more battery cells on which a non-self-diagnosable trouble has occurred;

FIG. 10 is a schematic diagram for explaining an application example.

DETAILED DESCRIPTION OF THE PREFERRED EMBODIMENTS

[Exemplary Configuration of Charging System]

Figure 2:
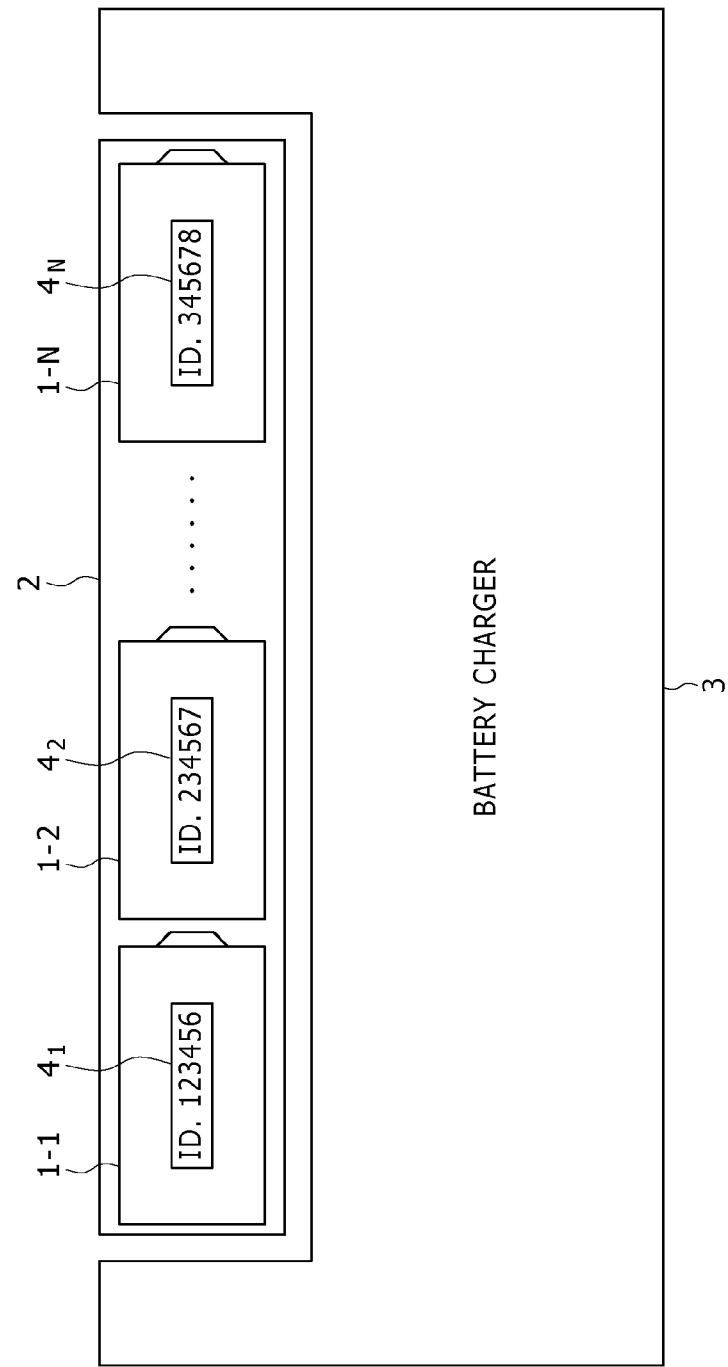
FIG. 2 is a schematic diagram illustrating an exemplary configuration of a charging system practiced as one embodiment of the present disclosure.

Now, referring to FIG. 2, there is shown an exemplary configuration of a charging system practiced as one embodiment of the present disclosure.

The charging system is made up of a battery pack 2 in which two or more battery cells 1 are interconnected and a charger 3. In the example shown in FIG. 2, N battery cells 1 are interconnected in series in the battery pack 2. If required, these N battery cells 1 will be described as battery cells 1-1 through 1-N. The battery pack 2 can be charged or discharged by loading the battery pack 2 on the charger 3. It should be noted that the charger 3 may be incorporated as a part of an electronic device such as a portable personal computer or a digital (video) camera, thereby forming a part of the electronic device along with the battery pack 2.

The battery cell 1 has communication functions as a transponder and a reader/writer which are based on electromagnetic induction which are communicable in a near-field and contactless manner and receives a charge state of another battery cell 1 adjacent before or after the former battery cell 1 in contactless communication. In addition, the battery cell 1 transmits a charge state of its own to another battery cell 1 adjacent before or after the former battery cell 1 along with a charge state received from another battery cell 1 mentioned above.

The charger 3 also has communication functions as a transponder and a reader/writer which are based on electromagnetic induction which are communicable in a near-field and contactless manner and receives a charge state transmitted from the battery cell 1 to control the charging of the battery pack 2.

For the near-field and contactless communication as the transponder and reader/writer which are based on electromagnetic induction, communication schemes are available which are compliant with ISO/IEC 14443 that is the standard for proximity IC card systems and ISO/IEC 18092 that is the standard for NFCIP (Near Field Communication Interface and Protocol)-1. The transponder is also called as an IC card, a tag, or RFID (Radio Frequency IDentification). In other words, the communication function as a transponder is representative of the communication function as a card or a tag based on type A, type B of ISO/IEC 14443, FeliCa (trademark), or ISO 15963. However, the communication functions of the battery cell 1 and the charger 3 are not limited to these types of standardized contactless near-field communication; namely, the communication functions of the battery cell 1 and the charger 3 may be the contactless near-field communication based on electromagnetic induction with data modulating and communication rate uniquely specified.

The battery cell 1 is externally recognizably attached with a label 4 written with an ID for identifying the battery cell 1. To be more specific, battery cells 1-n (n=1, 2, ..., N) are attached with rebels 4n.

[Exemplary Configuration of Battery Cell]

Figure 3:
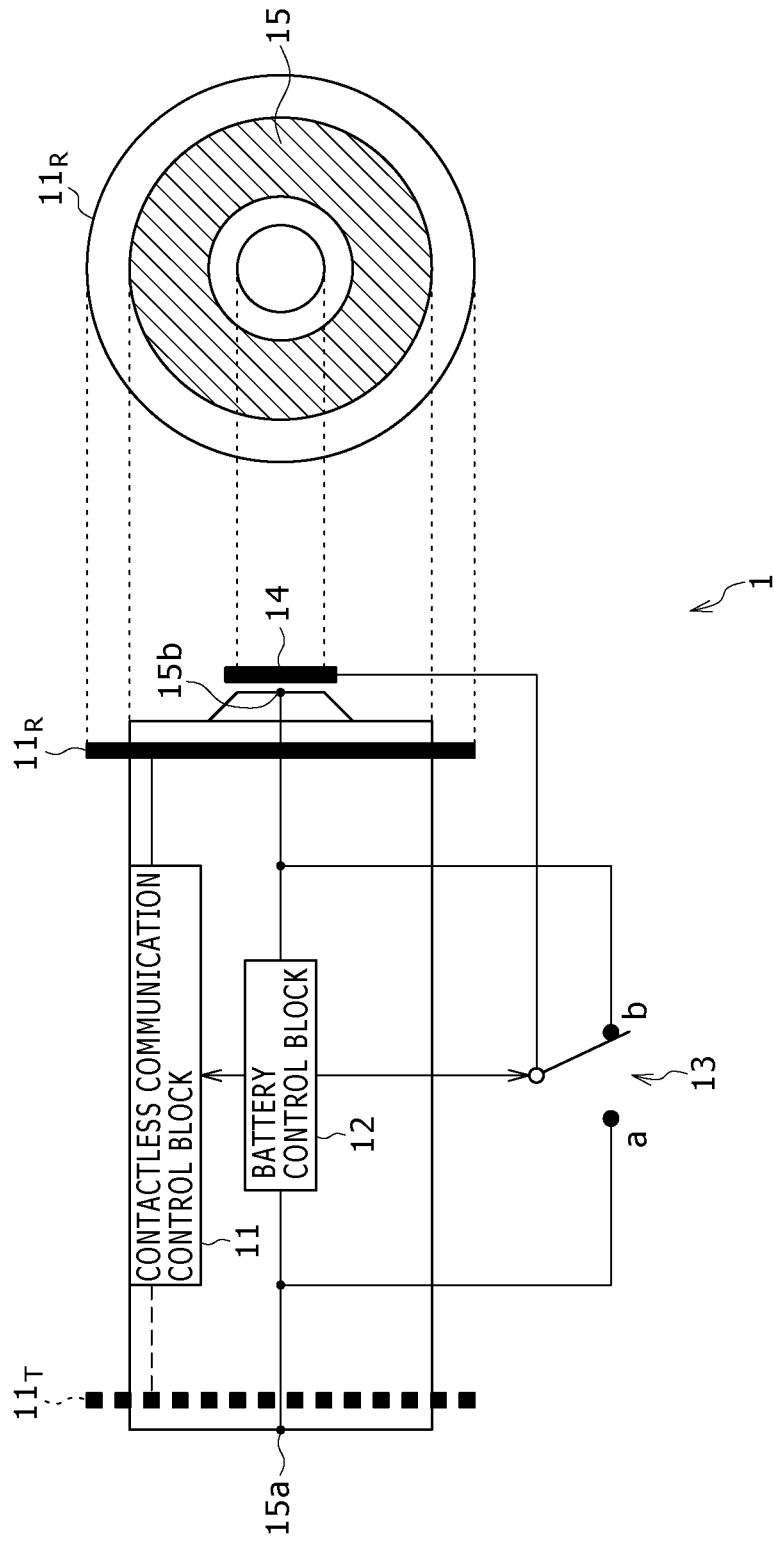
FIG. 3 is a schematic diagram illustrating an internal structure superimposed on an external view of a battery cell.

Referring to FIG. 3, there is shown a schematic diagram illustrating the battery cell 1 with the internal structure thereof superimposed on the external view thereof. The external view of the battery cell 1 is made up of a top view and a right side view.

The battery cell 1 at least has a contactless communication control block 11 and a battery control block 12.

The contactless communication control block 11 controls contactless near-field communication as a transponder and a reader/writer which are based on electromagnetic induction. To be more specific, if operating as a transponder, the contactless communication control block 11 receives a command from a reader/writer via a transponder antenna $11_T$. Next, the contactless communication control block 11 returns a response to the received command to the reader/writer. In addition, if operating as a reader/writer, the contactless communication control block 11 transmits a predetermined command to another transponder via a reader/writer antenna $11_R$ on the basis of status data indicative of a charge state of a cell block 15 supplied from the battery control block 12. Then, the contactless communication control block 11 receives a response to the predetermined command from that transponder. It should be noted that each command transmitted and received by the contactless communication control block 11 include data which is added to the command from time to time.

Figure 4:
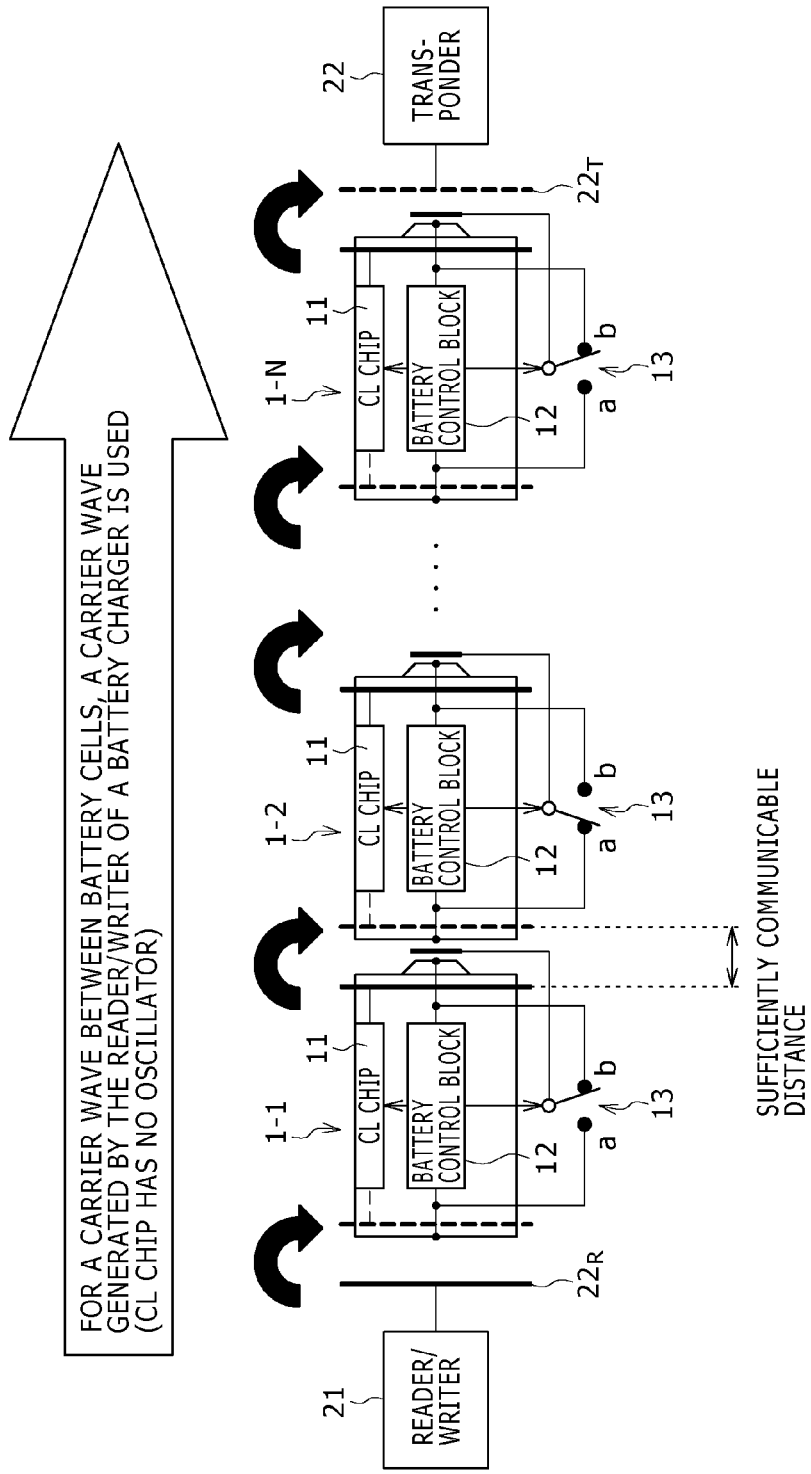
FIG. 4 is a schematic diagram illustrating for outlining contactless near-field communication.

The contactless communication control block 11 can be mounted on the battery cell 1 as an IC chip, for example and may be indicated as a CL (ContactLess) chip 11 in FIG. 4 and subsequent figures. The transponder antenna $11_T$ is arranged at one end of the length of the battery cell 1 and the reader/ writer $11_R$ is arranged at the other end of the length of the battery cell 1. The reader/writer antenna $11_R$ is wound around the cylindrical cell block 15 to form a loop antenna.

The battery control block 12 detects a charge state and a temperature state of the cell block 15 in the battery cell 1 to control the battery cell. In accordance with the detected charge state and temperature status of the cell block 15, the battery control block 12 sets a switch 13 to "a" side or "b" side. In addition, the battery control block 12 supplies status data indicative of the charting state and temperature state of the cell block 15 to the contactless communication control block 11.

When the switch 13 is set to the "a" side, one cell terminal 15a of the cell block 15 which is also the negative electrode terminal of the battery cell 1 is connected to the positive electrode terminal 14 of the battery cell 1, thereby putting the battery cell 1 into a bypass mode in which a charging current from the charger 3 is not supplied to the cell block 15 of the battery cell 1. On the other hand, when the switch 13 is set to the "b" side, the positive electrode terminal 14 of the battery cell 1 is connected to a cell terminal 15b which is the other end of the cell block 15, thereby putting the battery cell 1 into a normal mode (or charging mode) in which a charging current from the charger 3 is supplied to the cell block 15. It should be noted that the positive electrode terminal 14 of the battery cell 1 is completely insulated from the cell terminal 15b of the cell block 15.

The circuit of the switch 13 is configured such that the "b" side, namely, the normal mode is selected by voltage application. Therefore, if the battery control block 12 gets out of control to prevent the application of voltage to the switch 13, for example, the switch 13 is set to the bypass mode (namely, the "a" side).

[Outline of the Communication Between Battery Cells 1]

Referring to FIG. 4, there is shown a schematic diagram illustrating an outline of the contactless near-field communication which is executed between the charger 3 and the battery cell 1 or between the battery cells 1.

The battery cell 1-1 receives a command transmitted from a reader/writer 21 in the charger 3 via a reader/writer antenna $21_R$ by contactless near-field communication. If no trouble is found, the battery cell 1-1 returns a response acknowledging the command received from the reader/writer 21 in the charger 3; if a trouble is found, the battery cell 1-1 returns a trouble code. In addition, the battery cell 1-1 transmits status data including a charge state of its own (the battery cell 1-1) to the battery cell 1-2. The battery cell 1-2 receives a command and status data from the battery cell 1-1 by contactless near-field communication. Then, the battery cell 1-2 returns a response to the battery cell 1-1 and transmits, to the battery cell 1-3 (not shown), status data with a charge state of its own (the battery cell 1-2) added to the status data of the battery cell 1-1.

Subsequently, the status data is sequentially relayed between the adjacent battery cells as described above. Next, the battery cell 1-N transmits, to a transponder 22 in the charger 3, status data with a charge state of its own (the battery cell 1-N) added to a status data received from the battery cell 1-(N−1) by contactless near-field communication. The transponder 22 in the charger 3 receives the status information transmitted from the battery cell 1-N via a transponder antenna $22_T$.

It should be noted that a distance between the reader/writer antenna $11_R$ of the battery cell 1 and the transponder antenna $11_T$ of another battery cell 1 between which contactless near-field communication is executed is in a range with which contactless near-field communication of approximately several millimeters to several centimeters is practicable. This generally holds true with the a distance between the reader/writer antenna $21_R$ in the charger 3 and the transponder antenna $11_T$ of the battery cell 1-1 and a distance between the reader/writer antenna $11_R$ of the battery cell 1-N and the transponder antenna $22_T$ in the charger 3.

In the charging system, only the reader/writer 21 in the charger 3 can generate a carrier wave, the other component blocks transmitting commands by use of the carrier wave generated by the reader/writer 21. To be more specific, the reader/writer 21 in the charger 3 generates a carrier wave and modulates the generated carrier wave by a predetermined modulation scheme such as amplitude modulation (ASK) for example, thereby transmitting commands. The contactless communication control block 11 of the battery cell 1-1 uses the carrier wave received from the reader/writer 21 to transmit commands to the contactless communication control block 11 of the battery cell 1-2. Each of the subsequent battery cells 1-2 through 1-N uses the carrier wave received from the reader/writer side to transmit commands.

Consequently, each battery cell 1 need not have an oscillator for generating a carrier wave, resulting in the reduced cost of the battery cell 1. In addition, the communication clocks of the battery cells 1 are matched with each other by the carrier wave frequency of the reader/writer 21, thereby achieving synchronization.

[Functional Block Diagram Illustrating Battery Cells and Charger]

Referring to FIG. 5, there is shown a functional block diagram illustrating cells 1-n (n=1, 2, ..., N) and the charger 3. It should be noted that components similar to those previously described with reference to FIGS. 2 through 4 are denoted by the same reference numerals and the description thereof will be skipped.

The charger 3 has a contactless communication control block 31, a charging control block 32, and a power supply 33. The contactless communication control block 31 internally has a carrier-wave generating unit 31c.

The contactless communication control block 31 corresponds to the reader/writer 21 and the transponder 22 shown in FIG. 4. To be more specific, If the contactless communication control block 31 operates as a reader/writer, the contactless communication control block 31 modulates a carrier wave generated by the carrier-wave generating unit 31c in accordance with a command in a predetermined modulation scheme, transmitting the modulated carrier wave from the reader/writer antenna $21_R$ to the battery cell 1-1. The battery cell 1-1 modulates the carrier wave outputted from the reader/writer antenna $21_R$ and the contactless communication control block 31 receives this modulated carrier wave to receive a response from the battery cell 1-1.

If the contactless communication control block 31 operates as a transponder, the contactless communication control block 31 receives, via the transponder antenna $22_T$, a carrier wave outputted from the reader/writer antenna $11_R$ of the battery cell 1-N and modulated in accordance with a command, thereby receiving a command from the battery cell 1-N. In addition, the contactless communication control block 31 modulates a carrier wave outputted from the reader/writer antenna $11_R$ of the battery cell 1-N to transmit a response to the battery cell 1-N.

Data which is transmitted and received by contactless communication includes a command code indicative of the type of command or response, a same ID as that written to label 4 of the battery cell 1, and status data indicative of a charge state (a counter to be described later), for example. If a trouble occurs on the battery cell 1, a trouble code indicative of the details of a detected trouble for example is transmitted and received. The data to be transmitted and received will be described later in detail with reference to FIG. 6.

The charge control block 32 controls the supply of the power supply 33 on the basis of the charting states of the battery cells 1-1 through 1-N supplied from the contactless communication control block 31, thereby controlling the charging of the battery cells 1-1 through 1-N.

The contactless communication control block 11 of the battery cell 1-n operates as a reader/writer and a transponder like the contactless communication control block 31 of the charger 3. Only difference between the contactless communication control block 11 and the contactless communication control block 31 lies in that, if the contactless communication control block 11 operates as a reader/writer, the contactless communication control block 11 does not generate a carrier wave on its own but uses a carrier wave generated by the carrier-wave generating unit 31c of the charger 3, thereby transmitting data.

The reader/writer with the battery cell 1-n operating as a transponder becomes the charger 3 if n=1; if n=2 to N, the reader/writer becomes the battery cell 1-(n−1). The transponder with the battery cell 1-n operating as a reader/writer becomes the battery cell 1-(n+1) if n=1 to N−1; if n=N, then the transponder becomes the charger 3.

The contactless communication control block 11 obtains status data indicative of a charge state of the cell block 15 from the battery control block 12 and transmits the status data including a charge state of its own (the cell block 15) to the following transponder (the battery cell 1-(n+1) if n≠N; the charger 3 if n=N).

The battery control block 12 detects a charge state and a temperature state of the cell block 15 to control the cell block 15 and, at the same time, supplies status data indicative of the detected charge state and temperature state of the cell block 15 to the contactless communication control block 11. In addition, in accordance with the detected charge state and temperature state of the cell block 15, the battery control block 12 changes the settings of the switch 13 to the "a" side or the "b" side. It should be noted that the switch 13 shown in FIG. 3 is conventionally divided into a switch 13x and a switch 13y in FIG. 5, the switch 13x and the switch 13y being controlled in a linked manner as one switch 13.

When the switch 13 is set to the "a" side, then the bypass mode is provided in which a charging current from the charger 3 is not supplied to the cell block 15. On the other hand, when the switch 13 is set to the "b" side, then the normal mode (the charging mode) is provided in which a charging current from the charger 3 is supplied to the cell block 15.

The battery control block 12 can be configured in one IC chip along with the contactless communication control block 11. In this configuration, the power supplies to the contactless communication control block 11 and the battery control block 12 may be based on the power generated from the carrier wave transmitted from the reader/writer side or the power of the cell block 15 of their own.

[Operation to be Executed at Normal Charging]

The following describes operations of the battery cells 1-1 through 1-N to be executed when these cells are normally charged with reference to FIG. 6.

Each battery cell 1 is not always charged at a same level. In other words, the timing with which each battery cell 1 is fully charged is different among the battery cell 1-1 through 1-N. The battery control block 12 of each battery cell 1 measures the charging ratio of the cell block 15 and, when the battery cell 1 has been fully charged, sets the switch 13 to the "a" side, thereby putting the battery cell 1 into the bypass mode. FIG. 6 shows an example in which the battery cell 1-2 has been fully charged and set in the bypass mode.

The charge control block 32 of the charger 3 causes the contactless communication control block 31 to transmit a command for checking the charge state. The contactless communication control block 11 of the battery cell 1-1 receives the command for checking the charge state from the contactless communication control block 31 of the charger 3. The command for checking the charge state received from the contactless communication control block 31 is added with a counter with "0" set as the initial value as data.

The contactless communication control block 11 of the battery cell 1-1 receives, from the battery control block 12, status data indicative that the cell block 15 of its own (The battery cell 1-1) has not yet been fully charged but is normally being charged and increments the received counter value by 1. Then, the contactless communication control block 11 of the battery cell 1-1 transmits the command for checking the charge state to the contactless communication control block 11 of the battery cell 1-2 along with the incremented counter.

The contactless communication control block 11 of the battery cell 1-2 receives the command for checking the charge state from the battery cell 1-1. The status data obtained by the contactless communication control block 11 of the battery cell 1-2 from the battery control block 12 is indicative of a fully charge state. In this case, the contactless communication control block 11 of the battery cell 1-2 transmits the command for checking the charge state and counter to the contactless communication control block 11 of the battery cell 1-3 by leaving the counter value unchanged.

As described above, the contactless communication control block 11 of the battery cell 1 obtains status data from the battery control block 12 of its own and, if the obtained status data is indicative that the battery cell 1 is being normally charged, increments the counter value or leaves the counter value unchanged if the battery cell 1 has been fully charged. Next, the contactless communication control block 11 transmits a result of counting processing in accordance with the charge state to the following battery cell 1. Therefore, if the counter received by the contactless communication control block 31 of the charger 3 from the battery cell 1-N is more than 1, then it indicates that at least one of the battery cells 1-1 through 1-N has not been fully charged. On the other hand, if all of the battery cells 1-1 through 1-N are fully charged, then the counter received by the contactless communication control block 31 of the charger 3 from the battery cell 1-N is 0.

It should be noted that the transponder side which received the command for checking a charge state returns a response indicative of the acknowledgement of the command to the reader/writer side unless no trouble is encountered on the transponder.

As described above, according to the charging system shown in FIG. 2, transmission and reception of status data (charge/discharge control data) by contactless communication allows the management of the charge/discharge status of each battery cell 1, so that the related-art wiring for obtaining charge/discharge data becomes unnecessary. To be more specific, if the number of battery cells 1 increases, charge and discharge control can be executed on the battery cells 1 with a simple structure. In addition, the charger 3 can transmit and receive charge/discharge status of each battery cell 1 to properly execute charge/discharge control.

It should be noted that, in the example mentioned above, one contactless communication control block 11 and one battery control block 12 are arranged for one battery cell 1; it is also practicable to arrange one contactless communication control block 11 and one battery control block 12 for two or more battery cells 1. To be more specific, charge states may be managed in units of two or more battery cells to transmit and receive status data by contactless communication. Further, it is also practicable to arrange one contactless communication control block 11 and one battery control block 12 for the battery pack 2 in which two or more battery cells 1 are interconnected and manage the charge state on a battery pack basis, thereby transmitting and receiving status data by contactless communication. It should be noted however that this charge/discharge management is executed in units in which the management is executed by one contactless communication control block 11.

The method in which the counter value 0 or not is transmitted and received as described above is a simple method of managing the charge state of the battery pack 2 by the charge control block 32 of the charger 3. It is also practicable for the finer management by the charge control block 32 to change the data to be transmitted and received to more detailed data. For example, the data may be the data itself such as the charging ratio or the temperature of each battery cell 1. If this is practiced, no status monitoring wiring is required except for the electrode connection to result in the simple design of the battery pack 2, thereby enhancing the reliability of the battery pack 2 and saving the manufacturing cost of the battery pack 2.

[Operation to be Executed at Occurrence of Self-Diagnosable Trouble]

The following describes an operation to be executed if a self-diagnosable trouble occurs on the battery cell 1 with reference to FIG. 7. A self-diagnosable trouble denotes a trouble such as an overcurrent or abnormal temperatures about which a trouble code can be transmitted with the contactless communication control block 11 at least normally operating, for example.

Referring to FIG. 7, there is shown an example in which a self-diagnosable trouble has occurred on the battery cell 1-2.

Upon detecting a trouble, the battery control block 12 of the battery cell 1-2 sets the switch 13 to the "a" side to set the bypass mode. Next, the battery control block 12 supplies trouble code A indicative of trouble contents A to the contactless communication control block 11. The contactless communication control block 11 obtains status data in which trouble code A is included from the battery control block 12.

The contactless communication control block 11 of the battery cell 1-2 returns trouble code A indicative of trouble contents A in which the ID of the troubled battery cell 1-2 is included in response to a command received from the contactless communication control block 11 of the battery cell 1-1.

At the same time, the contactless communication control block 11 of the battery cell 1-2 transmits a command for checking a charge state with the counter value received along with the command unchanged (namely, without incrementing the counter) in the same manner as that of full charge to the contactless communication control block 11 of the battery cell 1-3.

Receiving trouble code A of the battery cell 1-2, the contactless communication control block 11 of the battery cell 1-1 returns trouble code A including the ID of the battery cell 1-2 in the next communication with the charger 3. Consequently, the charger 3 can detect the occurrence of the trouble indicated by trouble code A on the battery cell 1-2. If at least one of the battery cells 1 has a trouble, the charger 3 may output an alert by such means as an alert light or trouble message output, for example.

It should be noted that the battery cell 1-2 may return only trouble code A indicative of contents A of an encountered trouble and the battery cell 1-1 may add the ID of the battery cell 1-2 on which the trouble occurred to trouble code A and transmit (or return) trouble code A to the charger 3.

[Operation to be Executed at Occurrence of Non-Self-Diagnosable Trouble]

The following describes an operation to be executed if a trouble which is not self-diagnosable occurs on the battery cell 1 with reference to FIG. 8. A non-self-diagnosable trouble denotes a trouble which occurs not only on the battery control block 12 but also on the contactless communication control block 11, thereby disabling contactless communication itself.

Referring to FIG. 8, there is shown an example in which a non-self-diagnosable trouble occurred on the battery cell 1-2.

As described above, the circuit of the switch 13 configured to be set to the "b" side upon voltage application, namely, to select the normal mode. Therefore, if a trouble occurs on the battery control block 12 to disable the control by the battery control block 12, the switch 13 is set to the bypass mode (the "a" side).

If some trouble occurs on the contactless communication control block 11 to disable contactless communication itself, then the command for checking a charge state transmitted from the battery cell 1-1 cannot be replied.

If no response is made to the command for checking charge state from the battery cell 1-2, then the contactless communication control block 11 of the battery cell 1-1 returns trouble code B of contents B indicative of no-response including the ID of its own (the battery cell 1-1) in the communication with the next charger 3. Consequently, the charger 3 can detect the occurrence of a trouble of trouble code B in the battery cell 1-2 next to the battery cell 1-1.

In this case, the command for checking charge state is not transmitted to the battery cells 1-3 through 1-N following the battery cell 1-2. However, the switch 13 of the battery cell 1-2 is in the bypass mode, the charge current from the charger 3 is also supplied to the battery cells 1-3 through 1-N. Each of the battery cells 1-3 through 1-N uniquely manages the charge state as "temporary mode."

As described above with reference to FIGS. 7 and 8, if a trouble is detected on any one of the battery cells 1-1 through 1-N, the charger 3 can recognize the contents of the detected trouble and failed battery cell 1 by contactless communication. The charger 3 which recognized the occurrence of the trouble can display the trouble code indicative of the contents of the detected trouble and ID of the failed battery cell 1 onto a predetermined display block. Consequently, the user who recognized the display of the failed battery cell 1 on the predetermined display block can compare the battery cell 1 with the ID of label 4 attached to the outside of the battery cell 1 to replace the failed battery cell 1, for example. Therefore, only the failed battery cell 1 can be replaced with ease, thereby simplifying the repair work. It should be noted that, instead of recognizing the failed battery cell 1 by the ID of label 4 attached to the outside of the battery cell 1, the failed battery cell 1 may be identified by turn-on of a light which is costlier than the label ID recognition.

[Exemplary Arrangement of Battery Cells]

Figure 9A:
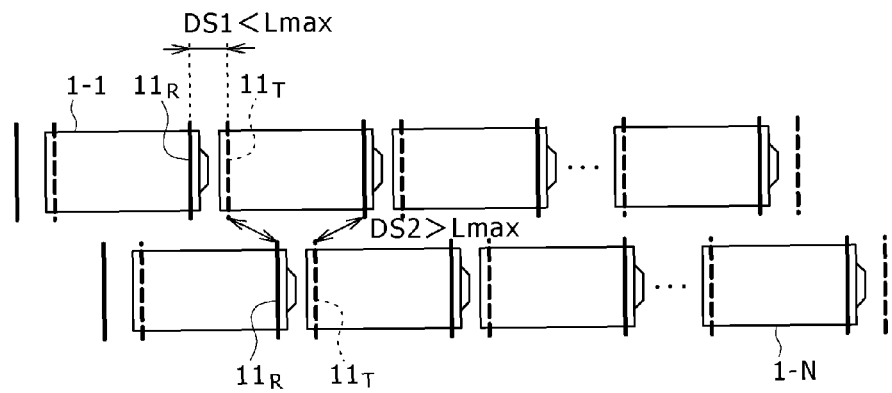
FIGS. 9A, 9B, and 9C are schematic diagram illustrating another arrangement example of two or more cells.
Figure 9B:
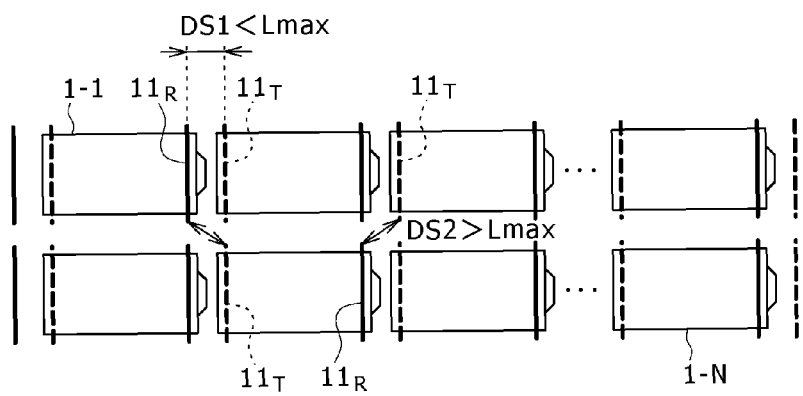
Figure 9C:
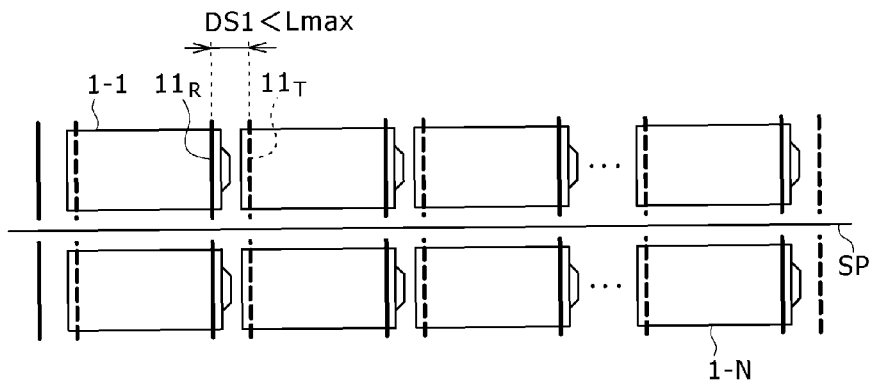

Referring to FIGS. 9A, 9B, and 9C, there are shown another exemplary arrangement of two or more battery cells.

In the example shown above, N battery cells 1-1 through 1-N are arranged in one row connected with each other in series. However, two or more battery cells 1 making up the battery pack 2 may be arranged in another manner; two or more rows of two or more battery cells 1 interconnected in series are arranged vertically to the length direction as shown in FIGS. 9A through 9C, for example.

FIGS. 9A and 9B show examples in which N battery cells 1-1 through 1-N are arranged in two rows in parallel, each row having N/2 battery cells. FIG. 9A shows an example in which the adjacent rows is shifted in the length direction by about a half of the cell length of the battery cell 1. FIG. 9B shows an example in which the adjacent rows are arranged at the same position in the length direction.

In the exemplary arrangements shown in FIGS. 9A and 9B, the distance between the reader/writer antenna $11_R$ and the transponder antenna $11_T$ which communicate each other in a contactless manner is distance DS1 less than the maximum value of communicable distance (hereafter referred to as a maximum communication distance) Lmax. On the other hand, the distance between the reader/writer antenna $11_R$ and the transponder antenna $11_T$ which do no communicate each other in a contactless manner is distance DS2 sufficiently greater than the maximum communication distance Lmax at the nearest.

FIG. 9C shows an example in which N battery cells 1-1 through 1-N are arranged in two rows in parallel, each row having N/2 battery cells, and a separator SP is arranged between the adjacent rows in order to prevent the interference of electromagnetic waves (carrier waves). In this case, the distance between the adjacent rows can be made smaller than that of the arrangement shown in FIG. 9B. The separator SP may be a shield.

In the examples mentioned above, the distance between the reader/writer antenna $11_R$ and the transponder antenna $11_T$ was described. It is obvious that the same holds with the distance between the transponder antenna $22_T$ of the charger 3 and the reader/writer antenna $21_R$.

It should be noted that, in the examples shown above, whether charge lines for the battery cells 1 arranged in two parallel rows are interconnected in parallel or series was not described. A method of charge line connection may be appropriately determined in accordance with necessary capacity and voltage. It should be noted that the contactless near-field communication is executed in units of one row.

The maximum communication distance Lmax depends on the diameter and magnetic field strength of the reader/writer antenna $11_R$ which is a loop antenna. The diameter of the reader/writer antenna $11_R$ is necessarily determined to be the diameter of the cell block $15+\alpha(>0)$ and cannot be changed because the reader/writer antenna 11R is wound around the external periphery of the cylindrical cell block 15. Hence, the maximum communication distance Lmax is determined by appropriately setting the magnetic field strength.

[Exemplary Applications]

If a trouble or troubles occur on one or more battery cells 1-1 through 1-N interconnected in series to make the failed battery cell or cells unusable, namely, if one or more battery cells 1-1 through 1-N have entered the bypass mode, then the output voltage of the battery pack 2 at the time of discharge drops.

In order to prevent this problem, a voltage regulator 51 can be arranged as shown in FIG. 10 to raise the voltage dropped by the bypass mode to the same level as the normal voltage level and output the regulated voltage. This arrangement allows the use of the power supply of the battery pack 2 as "temporary mode" if a trouble occurs on the battery cell 1 to cause a voltage drop. The coverage of the voltage regulator 51 over voltage drops can be appropriately determined in accordance with how many failed battery cells 1 are allowed. The voltage regulator 51 may be arranged in either the charger 3 or the battery pack 2.

Term "system" herein denotes an entire apparatus made up of two or more apparatuses.

While preferred embodiments of the present disclosure have been described using specific terms, such description is for illustrative purpose only, and it is to be understood that changes and variations may be made without departing from the spirit or scope of the following claims.

The present technology contains subject matter related to that disclosed in Japanese Priority Patent Application JP 2011-030057 filed in the Japan Patent Office on Feb. 15, 2011, the entire content of which is hereby incorporated by reference.

What is claimed is:

1. A battery comprising a plurality of battery cells interconnected in series, each battery cell having:
    a contactless communication control block configured to execute contactless communication as a transponder and a reader/writer based on electromagnetic induction;
    a first antenna configured to execute the contactless communication as the transponder;
    a second antenna configured to execute the contactless communication as the reader/writer; and
    a battery control block configured to control a charge operation of a cell block;
    wherein,
    the contactless communication control block communicates, in a contactless manner, a charge state of the cell block supplied from the battery control block with the contactless communication control block of the battery cell adjacent to one of the connection sides of the cell block, and
    the first antenna is arranged at one end portion of the battery and the second antenna is arranged at an opposite end portion of the battery with respect to a length direction of the battery.

2. The battery according to claim 1, further comprising a switch configured to switch between a normal mode in which a charge current is supplied from a charger to the cell block and a bypass mode in which the cell block is bypassed, the battery control block also controlling the switch.

3. The battery according to claim 2, wherein the switch is set to the bypass mode when no voltage is applied.

4. The battery according to claim 1, wherein the contactless communication control block transmits data by using a carrier wave received when the contactless communication control block operates as the transponder as a carrier wave for use when the contactless communication control block operates as the reader/writer.

5. The battery according to claim 1, wherein the battery is a battery pack.

6. A battery pack comprising:
    a plurality of battery cells interconnected in series;
    each of the plurality of battery cells having
        (a) a contactless communication control block configured to execute contactless communication as a transponder and a reader/writer that are based on electromagnetic induction,
        (b) a first antenna configured to execute the contactless communication as the transponder,
        (c) a second antenna configured to execute the contactless communication as the reader/writer, and
        (d) a battery control block configured to control a charge operation of a cell block, wherein,
        the contactless communication control block communicates, in a contactless manner, a charge state of the cell block supplied from the battery control block with the contactless communication control block of the battery cell adjacent to one of connection sides of the battery cell.

7. The battery pack according to claim 6, wherein the first antenna is arranged at one end of each of the plurality of battery cells and the second antenna is arranged at another end of each of the plurality of battery cells.

8. The battery pack according to claim 6, wherein a plurality of rows of two or more battery cells interconnected in series are arranged perpendicular to a length direction of the plurality of battery cells.

9. The battery pack according to claim 8, wherein the plurality of rows of two or more battery cells arranged perpendicular to the length direction of the plurality of battery cells are shifted adjacently from each other in the length direction.

10. The battery pack according to claim 8, wherein a separator is arranged between the plurality of rows of two or more battery cells arranged perpendicular to the length direction of the plurality of battery cells.

11. The battery pack according to claim 6, wherein each of the plurality of battery cells includes a switch for switching between a normal mode in which a charge current from a charger is supplied to the cell block and a bypass mode in which the cell block is bypassed, the switch being set to the bypass mode when no voltage is applied.

12. The battery pack according to claim 11, further comprising:
   a voltage regulator configured to make constant a voltage to be outputted to outside.

13. A charging system comprising:
   a battery pack; and
   a charger,
   wherein,
      the battery pack includes a plurality of battery cells interconnected in series, each of the plurality of battery cells having
         (a) a contactless communication control block of a battery cell configured to execute contactless communication as a transponder and a reader/writer which are based on electromagnetic induction,
         (b) a first antenna configured to execute the contactless communication as the transponder,
         (c) a second antenna configured to execute the contactless communication as the reader/writer, and
         (d) a battery control block configured to control a charge operation of a cell block,
      the contactless communication control block of the battery cell communicating, in a contactless manner, a charge state of the cell block supplied from the battery control block with the contactless communication control block of the battery cell adjacent to one of connection sides of the battery cell, and
      the charger includes
         (a) a contactless communication control block of the charger configured to execute contactless communication as a transponder and a reader/writer which are based on electromagnetic induction,
         (b) a third antenna configured to execute the contactless communication as the transponder,
         (c) a fourth antenna configured to execute the contactless communication as the reader/writer, and
         (d) a charge control block configured to control a charge current to be supplied to a battery pack,
      the contactless communication control block of the charger communicating a charge state of the battery pack in a contactless manner, the charge control block controlling the charge current in accordance with a charge state of the battery received by the contactless communication.

14. The charging system of claim 13, wherein each battery cell further comprises a switch configured to switch between a normal mode in which a charge current is supplied from a charger to the cell block and a bypass mode in which the cell block is bypassed, the battery control block also controlling the switch.

15. The charging system of claim 14, wherein the switch is set to the bypass mode when no voltage is applied.

16. The charging system of claim 13, wherein the contactless communication control block of each battery cell transmits data by using a carrier wave received when the contactless communication control block of the battery cell operates as the transponder as a carrier wave for use when the contactless communication control block operates as the reader/writer.

* * * * *